(12) United States Patent
Rosenthal

(10) Patent No.: US 6,201,429 B1
(45) Date of Patent: Mar. 13, 2001

(54) CLAMPED CASCODE LEVEL SHIFTER CIRCUIT

(75) Inventor: Bruce Rosenthal, Los Gatos, CA (US)

(73) Assignee: Analog Microelectronics, Inc., Santa Clara, CA (US)

(*) Notice: Subject to any disclaimer, the term of this patent is extended or adjusted under 35 U.S.C. 154(b) by 0 days.

(21) Appl. No.: 09/315,666

(22) Filed: May 20, 1999

(51) Int. Cl.[7] .............................................. H03K 19/0175
(52) U.S. Cl. ................................ 327/333; 326/62; 326/80
(58) Field of Search .................................... 327/333, 199, 327/200, 208, 209, 210, 218; 326/80, 81, 63, 68, 62

(56) References Cited

U.S. PATENT DOCUMENTS

| | | | |
|---|---|---|---|
| 5,399,920 | * 3/1995 | Van Tran | 326/83 |
| 5,502,412 | 3/1996 | Choi et al. | 327/333 |
| 5,559,464 | * 9/1996 | Oril et al. | 327/333 |
| 5,825,225 | * 10/1998 | Sugisawa et al. | 327/208 |

OTHER PUBLICATIONS

International Rectifier's HEXFET Designer's Manual, Sep. 1993, vol. III, International Rectifier, El Segundo, CA, p. 1652.

* cited by examiner

Primary Examiner—Tuan T. Lam
(74) Attorney, Agent, or Firm—Fernandez & Associates, LLP

(57) ABSTRACT

An improved level shifter circuit that toggles a "flying Flip-Flop" comprising a cross-coupled inverter pair with control devices driven out of phase through a pair of cascode transistors. The cross-coupled inverter pair provides pull-up to the positive rail, clamping to a High Side-Common (HSC), and providing Hysteretic Switching. The cascode transistors restrict the pull-down of the control devices, thereby preventing continuous current conduction.

10 Claims, 3 Drawing Sheets

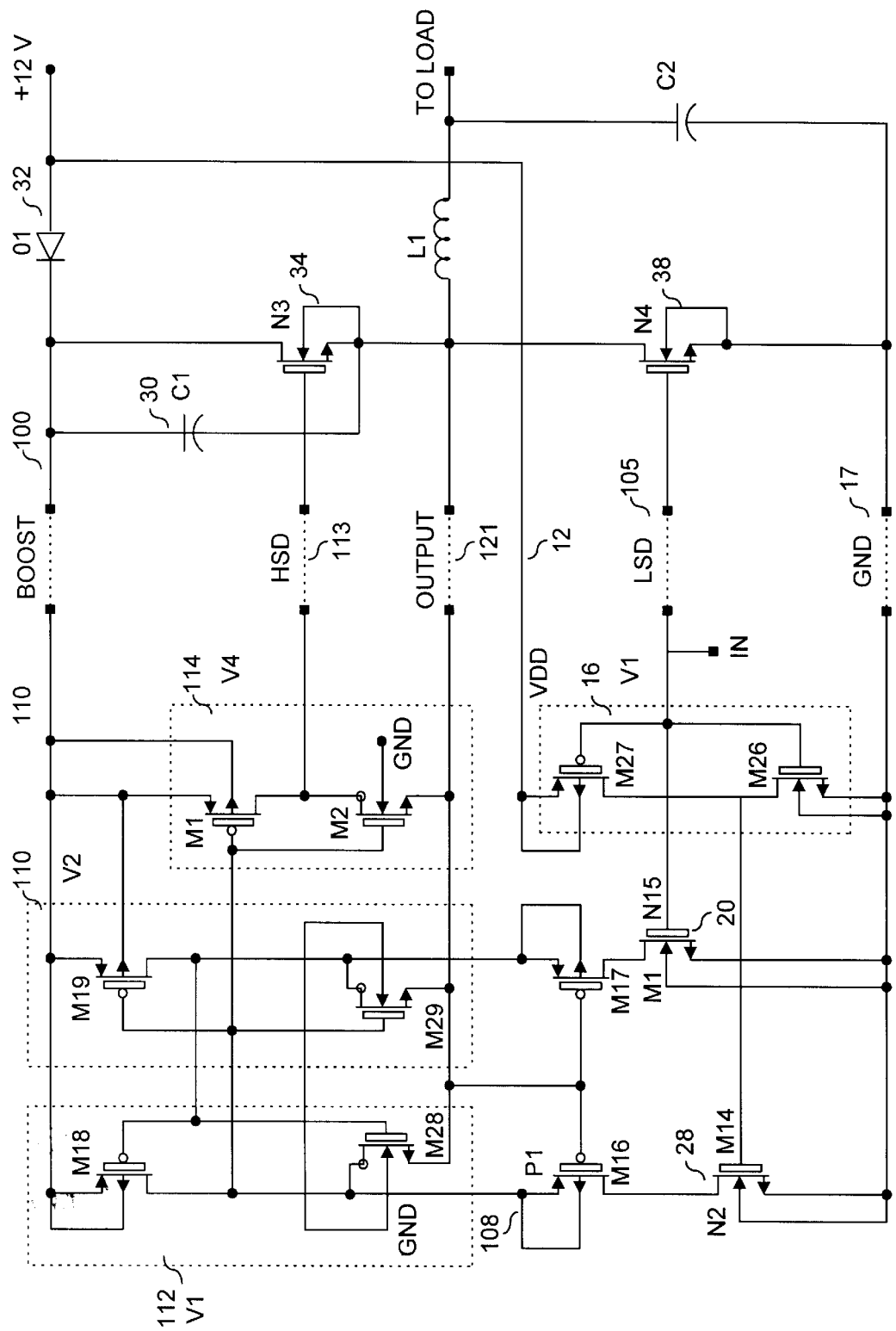
FIG. 3 - Cascode Clamp Level Shift Circuit

CLAMPED CASCODE LEVEL SHIFTER CIRCUIT

FIELD OF INVENTION

This invention relates to the field of circuit designs, particularly to voltage level shifter circuits.

BACKGROUND OF INVENTION

Level shifter circuits are frequently used to translate one voltage level to another. For example, to conserve power, the "core" voltage within an IC frequently operates at low voltage, but is scaled up at the output. A special class of level shifters is the "half bridge drivers" in which complementary signals are applied to an "upper" and "lower" device. In this application, typically the lower device does not require any special signal processing. The upper device requires level shifting in order to provide adequate Gate-Source enhancement, which is necessary because the source potential is not referenced to ground.

FIG. 1 illustrates a typical half-bridge circuit with a level shifter. Level shifter circuit 10 comprises a first inverter (V1) 16, a pair of control devices 20 and 28 (N1 and N2, respectively), and a cross-coupled pair devices 18 and 24 (P1 and P2, respectively). Complementary signals are applied to N1 and N2 which in combination with P1 and P2 allow node 26 (Q') to swing between Vboost 11 and ground. A half-bridge circuit 108 comprising transistors 34 and 38 (N3 and N4, respectively) and a boost circuit is generated by diode 32(D1) in combination with "flying capacitor" 30 (C1). A major disadvantage of level shifter circuit 10 is that devices N1, N2, P1 and P2 are all vulnerable to the full voltage excursion from ground to Vboost. This requires special high voltage processing to minimize or avoid the potential of damages to these devices, which adds to manufacturing cost. Furthermore, since the gates of P1 and P2 are driven to twice the voltage as N1 and N2, toggling of these devices from one state to another are further aggravated and made more difficult. There is therefore a need for a level shifter circuit that provides the necessary voltage shifting while minimizing the vulnerability of the level shifter to voltage excursions that may damage the circuit devices, as well as improving performance and minimizing difficulties in toggling devices from one state to another.

SUMMARY OF INVENTION

An improved level shifter circuit is provided by toggling a "flying Flip-Flop" comprising a cross-coupled inverter pair with control devices driven out of phase through a pair of cascode transistors. The cross-coupled inverter pair provides pull-up to the positive rail, clamping to a High Side-Common (HSC), and providing Hysteretic Switching. The cascode transistors restrict the pull-down of the control devices, thereby preventing continuous current conduction.

BRIEF DESCRIPTION OF DRAWINGS

FIG. 3 illustrates a more detailed block diagram of the level shifter circuit of FIG. 2.

DETAILED DESCRIPTION OF PREFERRED EMBODIMENT(S)

Figure 1:
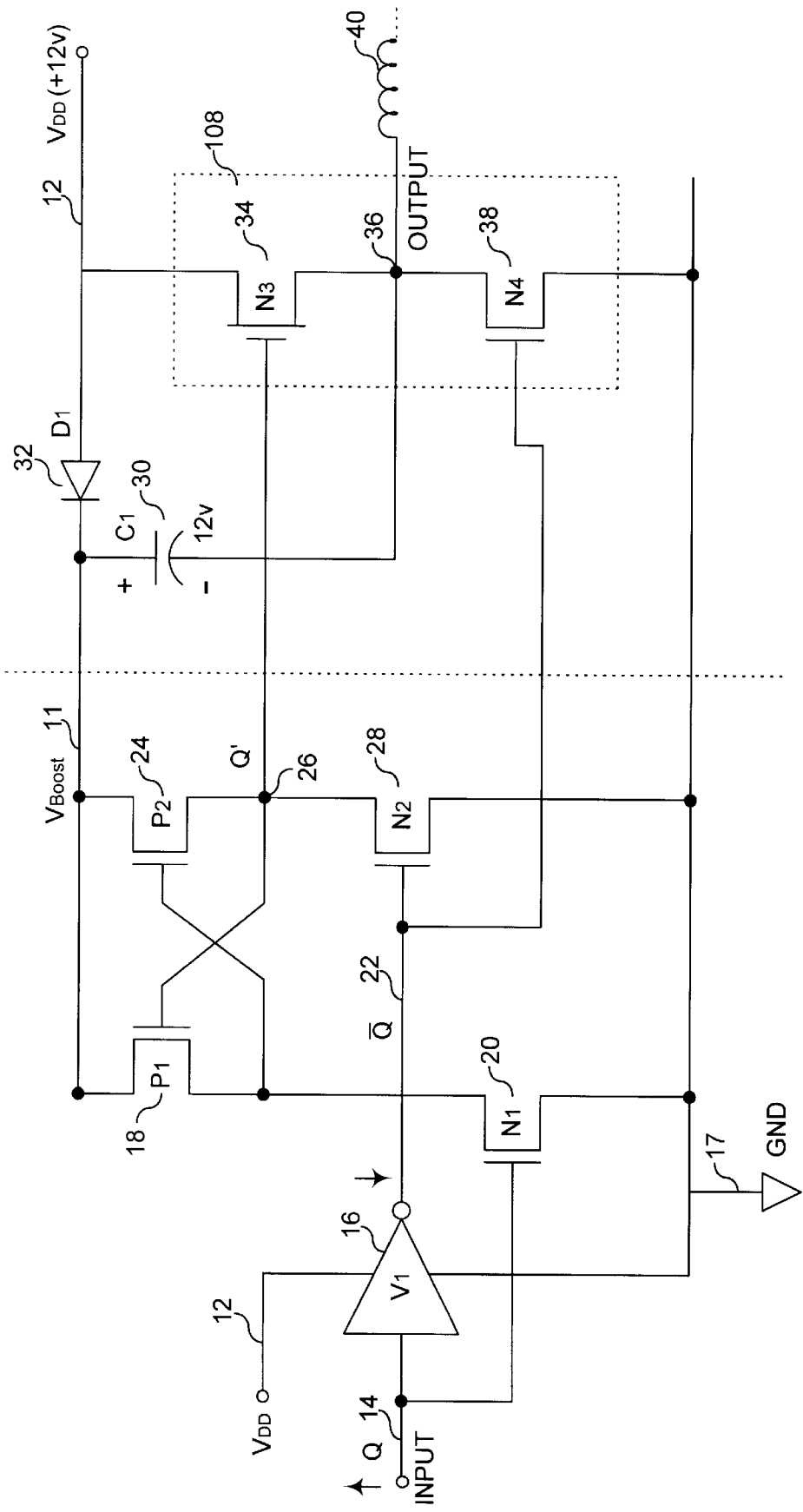
FIG. 1 illustrates a typical prior art half bridge level shifter circuit.
Figure 2:
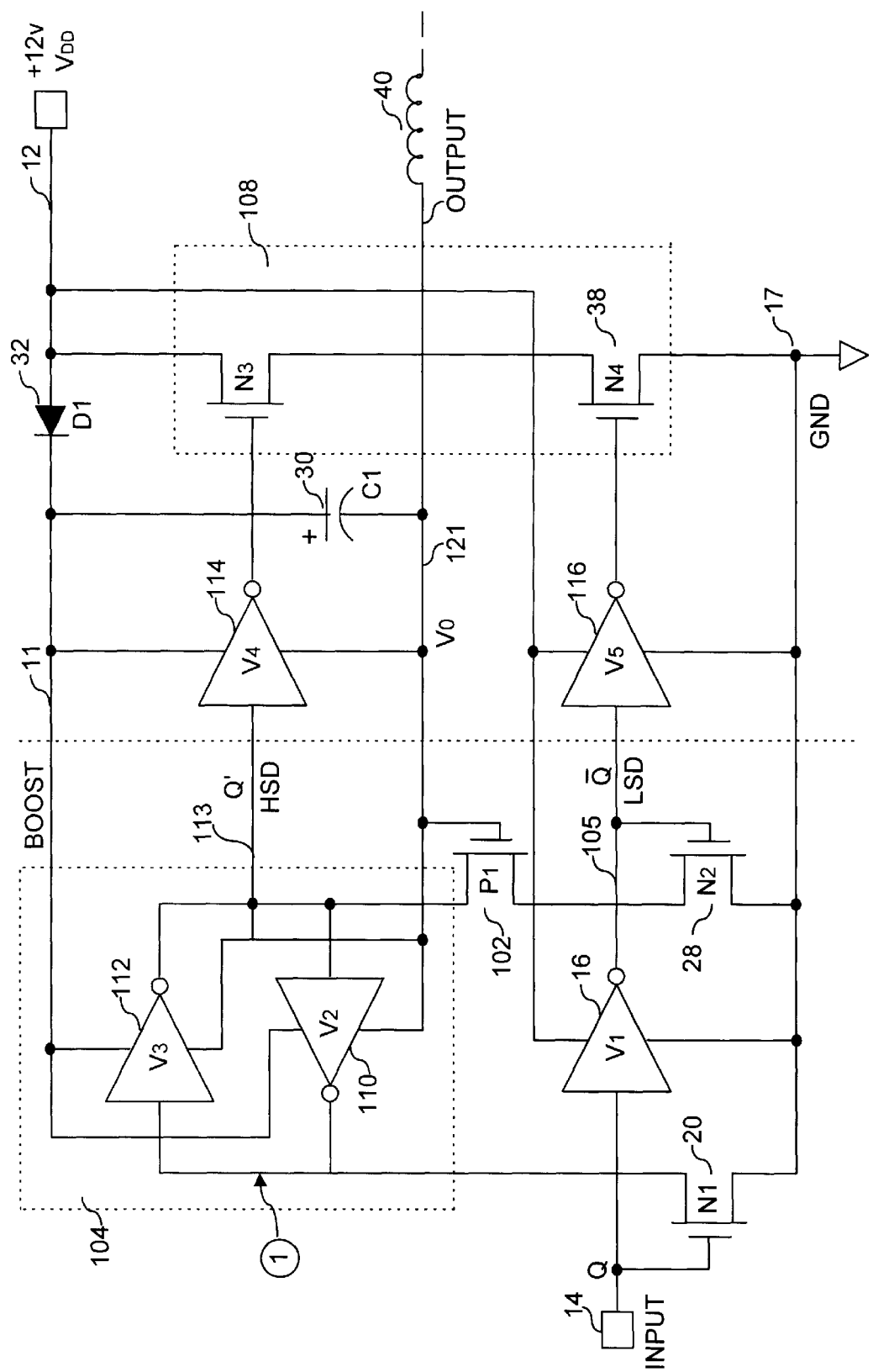
FIG. 2 illustrates a clamped cascode level shifter in accordance with the principles of this invention.

FIG. 2 illustrates a clamped cascode level shifter in accordance with the principles of this invention. Level shifter circuit 100 comprises a first inverter (V1) 16, a pair of control devices 20 and 28 (N1 and N2, respectively), and a first cascode clamp 102 (P1). In the preferred embodiment, a second cascode clamp (P2), not shown, is also provided for circuit symmetry and improved switching speed and performance (i.e., as shown in FIG. 3). A "flying Flip-Flop" 104 is provided comprising two back to back inverters 110 and 112 (V2 and V3, respectively) with ground return of each inverter coupled to an output of a half bridge circuit comprising switching devices 34 and 38 (N3 and N4, respectively).

As illustrated in FIG. 2, the source of device P1 is coupled at a voltage equivalent to a gate voltage above ground (i.e., Vg), thus allowing toggling of output node Q' 113 of inverter pair V2 and V3 between a voltage source rail voltage 12, (i.e., Vboost, wherein Vboost=VDD−VD1) and ground, without current flow between V3 and ground. Consequently, P1 in combination with N2 prevent over current condition in devices V2 110 and V4 114, and accordingly, thereby limiting voltage excursion that would otherwise damage the gate oxides of devices exposed to excessively large voltage swings, i.e., such as twice the voltage of rail voltage VDD. Overdrive condition of devices V2 110 and V4 114 and also excessive power consumption in level shifter circuit 100 are also consequently avoided.

In operation, complementary signals are applied to N1 and N2 via first inverter 16 (V1). Thus, for example, as N2 is switched on, the source of P1 is clamped at one gate voltage (Vg) above voltage at the base of P1 (Vo), thus allowing node 113 (Q') at an output of Flying Flip-Flop 104 to swing between Vboost and the output rail voltage (Vo) 121. Flip-Flop 104 is toggled by the conduction of N1 and N2, with output Q' swinging to Vboost when input Q is driven low. Then as Q' then swing towards voltage Vo, P1 shuts off, thereby preventing quiescent current flow from output of V3 through N2 to ground. In a half bridge driver application such as shown in FIG. 2, clamped cascode level shifter circuit 100 is coupled to a half-bridge circuit 108 comprising transistors 34 and 38 (N3 and N4, respectively) to provide voltage shift. In the preferred embodiment, an optional boost circuit comprising diode 32 (D1) in combination with "flying capacitor" 30 (C1) is also coupled to flying Flip-Flop 104 and cascode clamp P1 to provide current boost for faster transition and increased performance. Optionally, boost ther current circuit further comprises one or more inverters, i.e., V4 114 and V5 116, for added boost and faster transitions and increased performance.

In an alternative embodiment, as is illustrated in more detail in FIG. 3, a second cascode clamp P2 is also provided and coupled to N1, to provide similar voltage clamping and current limiting function described above with regards to P1 and N2. Adding P2 provides circuit symmetry and thus also improves switching time and performance.

FIG. 3 illustrates a sample detailed circuit schematic level implementation of the level shifter circuit of FIG. 2. Thus, the description provided above relative to the operation of cascode clamp level shifter circuit 100 of FIG. 2 also therefore applies to describe the operation of cascode clamp level shifter circuit shown in FIG. 3. Also shown in FIG. 3 is an optional implementation of a second cascode clamp device 103 (P2), not illustrated in FIG. 2, but which as discussed above with FIG. 2 would provide circuit symmetry and improved performance.

Foregoing described embodiments of the invention are provided as illustrations and descriptions. They are not intended to limit the invention to precise form described. In particular, Applicant(s) contemplate that functional implementation of invention described herein may be implemented equivalently in hardware, software, firmware, and/or other available functional components or building blocks. Other variations and embodiments are possible in light of above teachings, and it is thus intended that the scope of invention not be limited by this Detailed Description, but rather by Claims following.

What is claimed is:

1. A voltage level shifter circuit comprising:

a first switching device (N1), coupled to receive an input signal (Q);

a first inverter, the first inverter also coupled to receive the input signal Q and generating a first inverter output corresponding to an inverted polarity of the input signal Q;

a second switching device (N2), N2 coupled to the first inverter to receive the inverted polarity of input signal Q; and a cascode clamp device (P1), P1 being coupled in series between N2 and a flying flip-flop, wherein the flying flip-flop is also coupled to the N1 device to thereby generate a flying flip-flop output signal Q' that swings between a first voltage source rail voltage and a second voltage signal limited by the cascode clamp P1.

2. The voltage level shifter of claim 1 further comprising a half-bridge circuit, the half-bridge circuit coupled between the flying flip-flop output signal Q' and the cascode clamp P1 to thereby generate a voltage shifter output signal (Vo) that swings between a positive voltage source rail (VDD) and a ground level.

3. The voltage level shifter of claim 1 further comprising a current boost circuit for faster level shifting, wherein an input of the current boost circuit is coupled to the flying flip-flop and an output is coupled to a high-side switch (N3) for faster half bridge circuit performance.

4. A voltage level shifter circuit comprising:

a first switching device (N1), coupled to receive an input signal (Q);

a first inverter, the first inverter also coupled to receive the input signal Q and generating a first inverter output corresponding to an inverted polarity of the input signal Q;

a second switching device (N2), N2 coupled to the first inverter to receive the inverted polarity of input signal Q;

a cascode clamp device (P1), P1 being coupled in series to N2; and a flying flip-flop, wherein the flying flip-flop comprises a second inverter coupled at a second inverter input port to the cascode clamp and also coupled in series at a second inverter output port to a third inverter input port, a third inverter output port being also coupled back to the cascode clamp P1 to thereby generate a flying flip-flop output signal Q' that swings between a first voltage source rail voltage and a second voltage signal limited by the cascode clamp P1.

5. The voltage level shifter of claim 4 further comprising a half-bridge circuit, the half-bridge circuit coupled between the flying flip-flop output signal Q' and the cascode clamp P1 to thereby generate the voltage shifter output signal (Vo) that swings between a positive voltage source (VDD) and a ground level signal.

6. The voltage level shifter of claim 4 further comprising a current boost circuit for faster level shifting, wherein an input of the current boost circuit is coupled to the flying flip-flop and an output is coupled to a high-side switch (N3) for faster half bridge circuit performance.

7. A voltage level shifter circuit comprising:

a first switching device (N1), N1 comprising a gate input, the gate input coupled to receive an input signal (Q), a drain coupled to an output of a second inverter (V2) and an input of a third inverter (V3), N1 further comprising a source coupled to a ground level;

a first inverter, the first inverter also coupled to receive the input signal Q and generating an output signal equivalent to an inverted polarity of the input signal Q;

a second switching device (N2), N2 comprising a gate input coupled to the first inverter to receive the inverted polarity of input signal Q, a drain coupled to a cascode clamp P1, and a source coupled to the ground level voltage source rail voltage; and a cascode clamp device (P1), P1 comprises a gate input, a drain, and a source, wherein the drain is coupled in series to the drain of N2, the source coupled to an input of the second inverter and an output of the third inverter, and the gate input coupled to node Vo, wherein for inverters V2 and V3, each inverter further comprises a pull-up voltage source and a pull-down voltage source input, the pull-up voltage source input coupled to a first voltage source rail voltage, and the pull-down voltage source coupled to the node Vo, to thereby allow Vo to swing between a positive voltage source (VDD) voltage and the ground level.

8. The voltage level shifter of claim 7 further comprising:

a half bridge circuit, the half bridge circuit, coupled to the third inverter, comprising a third switch N3 and a fourth switch N4, wherein each switch comprises a gate input, a source and a drain, with the gate input of N3 being coupled to an output of a fourth inverter V4 and the drain of N3 coupled to the positive voltage source (VDD), and the source coupled to the drain of N4, the gate of N4 coupled to an output of inverter V5, and the source of N4 coupled to the ground level.

9. The voltage level shifter of claim 8 further comprising a boost circuit, coupled to the third inverter, the boost circuit comprising a first diode (D1) and a "flying capacitor" (C1), wherein an input of D1 is coupled to the positive VDD voltage source, and an output of D1 coupled to a first port of C1 and a second port of C1 coupled to the source of N3.

10. The voltage level shifter of claim 8 wherein each inverter V4 and V5 comprises an input port, an output port, a pull-up voltage input port, and a pull-down voltage input port, with the input port of V4 coupled to the source of P1, output port of V4 coupled to the gate input of N3, the pull-up voltage port coupled to the first voltage source rail voltage, and the pull-down voltage port coupled to the node Vo; and with the input port of V5 coupled to the output port of the first inverter with the output port of V5 coupled to the gate of N4, the pull-up voltage port of V5 coupled to VDD and the pull-down voltage port coupled to ground level.

* * * * *